United States Patent [19]

Everett

[11] Patent Number: 4,935,944
[45] Date of Patent: Jun. 19, 1990

[54] FREQUENCY DIVIDER CIRCUIT WITH INTEGER AND NON-INTEGER DIVISORS

[75] Inventor: Jody H. Everett, Buda, Tex.
[73] Assignee: Motorola, Inc., Schaumburg, Ill.
[21] Appl. No.: 325,708
[22] Filed: Mar. 20, 1989
[51] Int. Cl.⁵ .................... H03K 23/48; H03K 21/08
[52] U.S. Cl. ........................................ 377/48; 377/52; 377/56; 377/108; 377/110
[58] Field of Search .................. 377/48, 52, 56, 108, 377/110

[56] References Cited

U.S. PATENT DOCUMENTS

| | | | |
|---|---|---|---|
| 3,896,387 | 7/1975 | Kokado | 377/48 |
| 3,976,946 | 8/1976 | Schroder | 377/48 |
| 4,031,476 | 6/1977 | Goldberg | 377/48 |
| 4,041,403 | 8/1977 | Chiapparoli, Jr. | 377/48 |
| 4,193,037 | 3/1980 | Kyu | 377/110 |
| 4,295,056 | 10/1981 | Luscher | 377/79 |
| 4,573,176 | 2/1986 | Yeager | 377/48 |
| 4,587,664 | 5/1986 | Iida | 377/48 |
| 4,658,406 | 4/1987 | Pappas | 377/56 |
| 4,748,347 | 5/1988 | Tung | 307/450 |
| 4,866,741 | 9/1989 | Minuhin | 377/48 |

Primary Examiner—John S. Heyman
Attorney, Agent, or Firm—Robert L. King

[57] ABSTRACT

A frequency divider circuit for dividing an input signal with a predetermined integer or non-integer divisor. The frequency divider circuit comprises a polynomial counter, decode logic, and a clock edge selector. The polynomial counter, responsive to a clock signal at a predetermined frequency, cycles through a predetermined set of logic states which are logical combinations of the previous state, and generates a set of output signals which indicates the present logic state of the polynomial counter. The decode logic, responsive to the output signals of the polynomial counter, implements a predetermined logical mapping of said output signals into a decoded output signal. The clock edge selector, responsive to the decoded output signal of the decode logic, utilizes flip-flops and other logic to generate integer and non-integer multiples of the clock signal. The frequency divider circuit selects either integer or non-integer divisors depending on the informational content of a control signal.

14 Claims, 5 Drawing Sheets

FIG.2

| CLOCK CYCLE | SELECT | Q40 | Q42 | Q44 | Q46 | DECODE-OUT |
|---|---|---|---|---|---|---|
| 1 | 1 | 0 | 0 | 0 | 0 | 1 |
| 2 | 1 | 1 | 0 | 0 | 0 | 1 |
| 3 | 1 | 0 | 1 | 0 | 0 | 1 |
| 4 | 1 | 1 | 0 | 1 | 0 | 1 |
| 5 | 1 | 0 | 1 | 0 | 1 | 0 |
| 6 | 1 | 0 | 0 | 1 | 0 | 0 |
| 7 | 1 | 1 | 0 | 0 | 1 | 0 |
| 8 | 1 | 1 | 1 | 0 | 0 | 0 |
| 9 | 1 | 0 | 1 | 1 | 0 | 1 |
| 10 | 1 | 1 | 0 | 1 | 1 | 1 |
| 11 | 1 | 1 | 1 | 0 | 1 | 1 |
| 12 | 1 | 1 | 1 | 1 | 0 | 1 |
| 13 | 1 | 0 | 1 | 1 | 1 | 0 |
| 14 | 1 | 0 | 0 | 1 | 1 | 0 |
| 15 | 1 | 0 | 0 | 0 | 0 | 0 |

FIG.3

| CLOCK CYCLE | SELECT | Q40 | Q42 | Q44 | Q46 | DECODE-OUT |
|---|---|---|---|---|---|---|
| 1 | 0 | 0 | 0 | 0 | 0 | 1 |
| 2 | 0 | 1 | 0 | 0 | 0 | 1 |
| 3 | 0 | 1 | 1 | 0 | 0 | 1 |
| 4 | 0 | 0 | 1 | 1 | 0 | 0 |
| 5 | 0 | 0 | 0 | 1 | 1 | 0 |
| 6 | 0 | 0 | 0 | 0 | 1 | 0 |

FREQUENCY DIVIDER CIRCUIT WITH INTEGER AND NON-INTEGER DIVISORS

TECHNICAL FIELD

This invention relates generally to digital logic circuits, and more particularly, to frequency divider circuits which divide by both integor and non-integer values.

BACKGROUND OF THE INVENTION

Applications requiring the division of a signal of predetermined frequency by various divisors are quite common. The general class of frequency divider circuits typically receives, as an input signal, a reference clock signal with a fixed frequency. Previous frequency divider circuits have divided the clock signal by both integer, and less commonly, non-integer divisors. As is readily apparent, frequency divider circuits have broad utility in digital circuits which utilize a plurality of multiples of a predetermined signal. Specific applications include video or television displays, video encoders, home computers, Integrated Services Digital Network (ISDN) integrated circuits, and the like.

In a known frequency divider, as described by Jacob Luscher in U.S. Pat. No. 4,295,056 entitled "Integrated Frequency Divider", a shift register, comprising a plurality of cells serially connected one after the other, is supplied with two periodic signals. Circuitry is utilized for detecting a particular state of the shift register. A signal generator, responsive to the detecting of the state, is also provided for producing a signal with a frequency which is a sub-multiple of the periodic signals. This known frequency divider is especially well adapted to applications requiring the division of high frequency signals with minimal power consumption, as in quartz oscillator watches, but is limited to division by integer value divisors.

In another known frequency divider, as described in U.S. Pat. No. 4,193,037, entitled "Frequency Divider Circuit With Selectable Integor/ Non-Integer Divison" by Kyuetal, an input signal of a predetermined frequency is selectively divided by both integer and non-integer values. Logic circuitry responsive to predetermined transitions in first and second clock signals is provided for generating a series of output signals having frequencies which are predetermined integer and non-integer multiples of the clock signals. The output signals are respectively delayed delayed with respect to each other. The output signals are logically combined in order to generate both integer or non-integer multiples of the clock signals. This type of known frequency divider provides an inexpensive frequency divider circuit which can select either integer or non-integer divisors depending upon a control signal, but which may be susceptible to clock skew. Previous frequency dividers often utilize circuitry which requires a distributed network of clock signals for synchronization. Skew in the clock signals, with respect to each other, may reduce accuracy in the frequency of the generated signal. Additionally, other frequency dividers may require significantly additional logic circuitry in order to generate a given integer or non-integer multiple of two clock signals. Consequently, propagation delays or latency in known frequency dividers may be a function of a given integer or non-integer divisor.

BRIEF DESCRIPTION OF THE INVENTION

Accordingly, it is an object of the present invention to provide an improved frequency divider circuit with selectable integer and non-integer divisors and method thereof.

It is another object of the present invention to provide an improved frequency divider circuit with selectable integer and non-integer divisors and improved signal skew and signal propagation delay characteristics.

In carrying out these and other objects of the invention, there is provided, in one form, a frequency divider circuit and method for dividing an input signal with a predetermined frequency by either integer or non-integer values to provide an output signal of divided frequency. The frequency divider circuit comprises a counter which is responsive to the input signal. The counter functions to count from an initial state value to a final state value at a rate determined by the input signal. A set of encoded output signals are generated for indicating a present state value of the counter. The frequency divider circuit further comprises a first logic portion responsive to the set of output signals from the counter. The first logic portion implements a predetermined logical mapping of the set of output signals to provide a decoded output signal. A second logic portion, in one form, comprises two flip-flops and a selection portion. The two flip-flops each latch the decoded output signal of the first logic portion at a rate determined by the input signal and each flip-flop generates an output signal having a logic value determined by both the input signal and the decoded output signal. A selection portion responsive to the output signals of the first and second flip-flops continuously selects, in a sequence determined by the divisor, one of the two flip-flop outputs to be coupled to an output terminal as the divided frequency output signal.

These and other objects, features, and advantages, will be more clearly understood from the following detailed description taken in conjunction with the accompanying drawings.

BRIEF DESCRIPTION OF THE DRAWINGS

FIG. 2 is a state table which describes the operation of a counter of the frequency divider circuit of FIG. 1 during a non-integer divisor mode of operation;

FIG. 3 is a state table which describes the operation of the counter of the frequency divider circuit FIG. 1 during an integer divisor mode of operation;

DETAILED DESCRIPTION OF THE INVENTION

Figure 1:
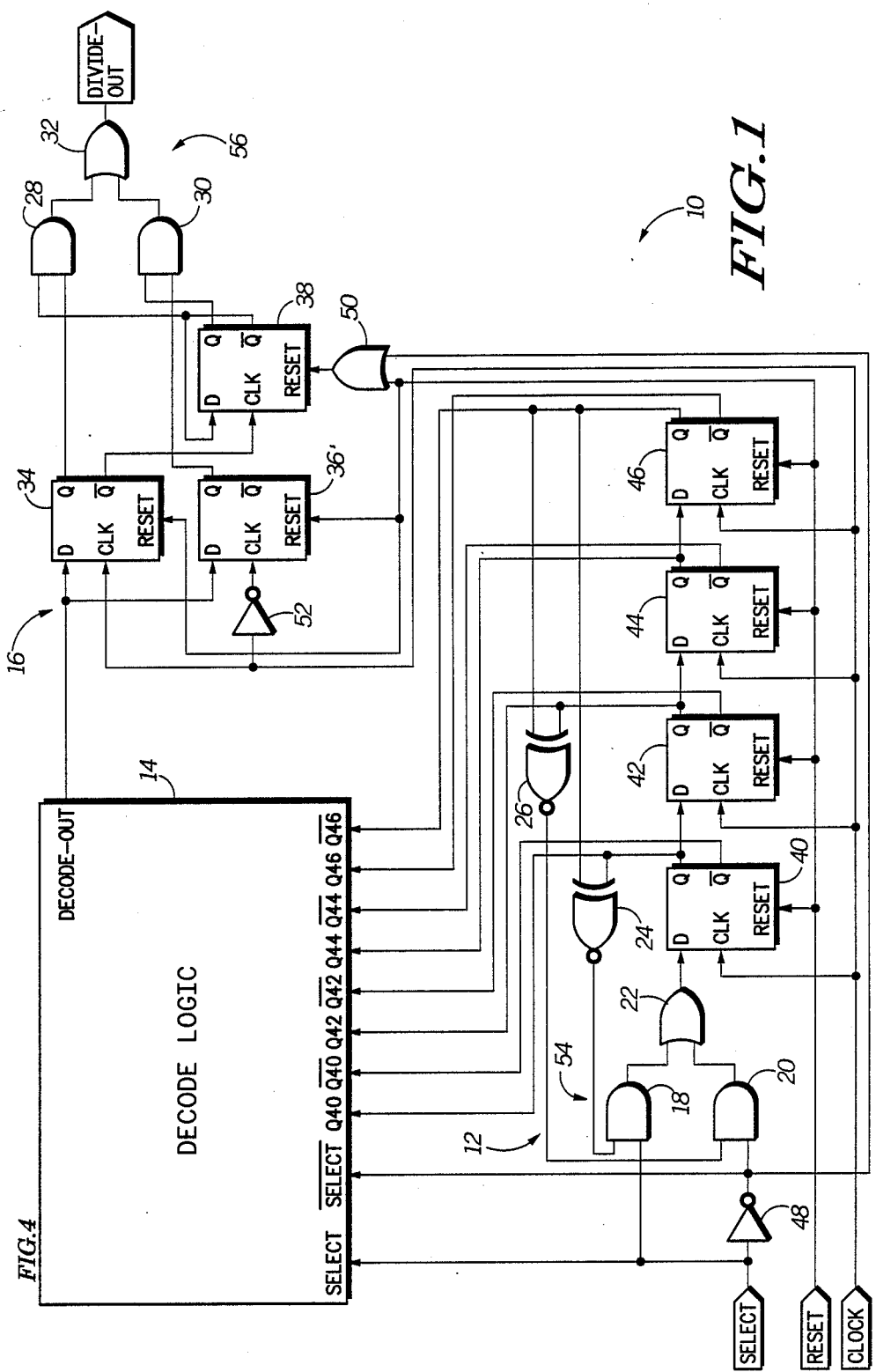
FIG. 1 illustrates in block diagram form a preferred embodiment of the frequency divider cirucit of the present invention.

Shown in FIG. 1 is a block diagram of a frequency divider circuit 10 with selectable integer and non-integer divisors in accordance with the present invention. Frequency divider circuit 10 generally comprises a polynomial divide-by-fifteen counter 12, decode logic 14, and a clock edge selector 16. Input signals labeled "Select", "Reset", and "Clock" are coupled to divider circuit 10.

Counter 12 has an inverted Select signal coupled via an inverter 48 to a first input of an AND gate 20, and an AND gate 18 having a first input coupled to the Select signal. An output of AND gate 18 is connected to a first input of an OR gate 22, and an output of AND gate 20 is connected to a second input of OR gate 22. An output of OR gate 22 is connected to a data input labeled "D" of a flip-flop 40. AND gates 18 and 20 and OR gate 22 form a first multiplexor 54. A date output of flip-flop 40 labeled "Q40" is connected to a first input of an exclusive NOR gate 24, to a first input of decode logic 14 labeled "Q40" and to a data input labeled "D" of a flip-flop 42. An output of exclusive NOR gate 24 is connected to a second input of AND gate 18. A complementary Q40 data output of flip-flop 40 is connected to a second data input of decode logic 14. Flip-flop 42 has a data ouput labeled "Q42" connected to a first input of an exclusive NOR gate 26, to a third data input labeled "Q42" of decode logic 14 and to a data input of a flip-flop 44. A complementary Q42 ouput of flip-flop 42 is connected to a fourth data input of decode logic 14. Flip-flop 44 has a data ouput labeled "Q44" connected to a fifth data input of decode logic 14 labeled "Q44" of decode logic 14 and to a data input labeled "D" of a flip-flop 46. A complementary Q44 output of flip-flop 44 is connected to a sixth data input of decode logic 14. A data output of flip-flop 46 labeled "Q46" is connected to a second input of exclusive NOR gate 24, to a second input of exclusive NOR gate 26 and to a seventh data input labeled "Q46" of decode logic 14. A complementary Q46 output of flip-flop 46 is connected to an eighth data input of decode logic 14. An output of exclusive NOR gate 26 is connected to a second input of AND gate 20.

Clock edge selector 16 generally comprises flip-flops 34, 36 and 38, an OR gate 50, an inverter 52 and a second multilplexor 56. The Select signal is further connected to an input of decode logic 14 labeled "Select", and the complementary Select signal is further connected to both a complementary Select input of decode logic 14 and to a first input of OR gate 50. The Clock signal is connected to a clock input of each of flip-flops 40, 42, 44 and 46, to an input of an inverter 52 and to a Clock input of flip-flop 34. The Reset signal is connected to a reset input of each of flip-flops 40, 42, 44 and 46, to a second input of OR gate 50 and to Reset inputs of flip-flops 34 and 36. An output of inverter 52 is connected to a clock input of flip-flop 36. An output of decode logic 14 labeled "Decode Out" is connected to data inputs respectively labeled "D" of flip-flops 34 and 36. A Q data output of flip-flop 34 is connected to a first input of an AND gate 28. A complementary Q data output of flip-flop 34 is connected to a clock input of flip-flop 38. A Q data output of flip-flop 36 is connected to a first input of an AND gate 30. A Q data output of flip-flop 38 is connected to a second input of AND gate 30, and a complementary Q data output of flip-flop 38 is connected to a second input of AND gate 28 and to a data input labeled "D" of flip-flop 38. An output of OR gate 50 is connected to the reset input of flip-flop 38. An output of AND gate 28 is connected to a first input of an OR gate 32, and an output of AND gate 30 is connected to a secon input of OR gate 32. OR gate 32 provides a frequency divided output signal labeled "Divide Out".

In operation, the input Select signal is a control signal for selecting one of the digital signals coupled to the second input of each of AND gates 18 and 20 to be outputted by OR gate 22. Specifically, if the Select input signal is a logic high, the signal at the second input of AND gate 18 is selected to be outputted from OR gate 22. In the opposite case, if input signal SELECT is a logic low, the signal at the second input of AND gate 20 is selected to be outputted from OR gate 22. The Q data output of flip-flop 38 and its complement function as a control signal for selecting between data inputs of second multiplexor 56 at the respective first inputs of AND gates 28 and 30. Although a specific logic design for each of multiplexors 54 and 56 has been presented, it should be readily understood that alternate implementations of a two input multiplexor would be suitable in place of the specific multiplexor design herein illustrated.

Polynomial counter 12 represents a class of counters distinguished from normal binary counters by the logic state which defines the counting sequence. In a four-bit binary counter, an initial logic state is represented by a data output of 0000, with successive logic states represented by the mathematical addition of "one" to the original data output. For example, a typical counting sequence for a four bit binary counter would start at 0000, and continue 0001, 0010, etc. to 1111. In a four-bit polynomial counter, such as polynomial counter 12, an initial logic state is also represented by a data output of 0000, but successive logic states are represented by logical combinations of the previous state, rather than additive increments. Shown in FIGS. 2 and 3 in table form are logic states for polynomial counter 12 as implemented in the present invention for non-integer and integer modes of operation, respectively. In both tables, the first column describes a clock cycle as determined by input signal Clock, while the second column represents the logic value of the Select signal. As will be shown, two divisor modes of operation exist for frequency divider 10 depending on the logic value of the Select input signal. The columns in FIGS. 2 and 3 under the headings Q40, Q42, Q44, and Q46 represent the logic state of polynomial counter 12 as determined by the Q data outputs of flip-flops 40, 42, 44 and 46, respectively. The far right column of each of the tables in FIGS. 2 and 3 indicates the logic value at the Decode Out output terminal of decode logic 14. It should be noted from FIGS. 2 and 3 that successive logic states are not additive increments of the previous logic state. Rather, logic states of decode logic 14 are determined by a logical exclusive NOR function of either the first and fourth data inputs (Q data outputs of D flip-flops 40 and 46) or the second and fourth data bits (Q data ouputs of D flip-flops 42 and 46) of polynomial counter 12. Selection between the two logic combinations is controlled by the Select input signal.

Figure 4:
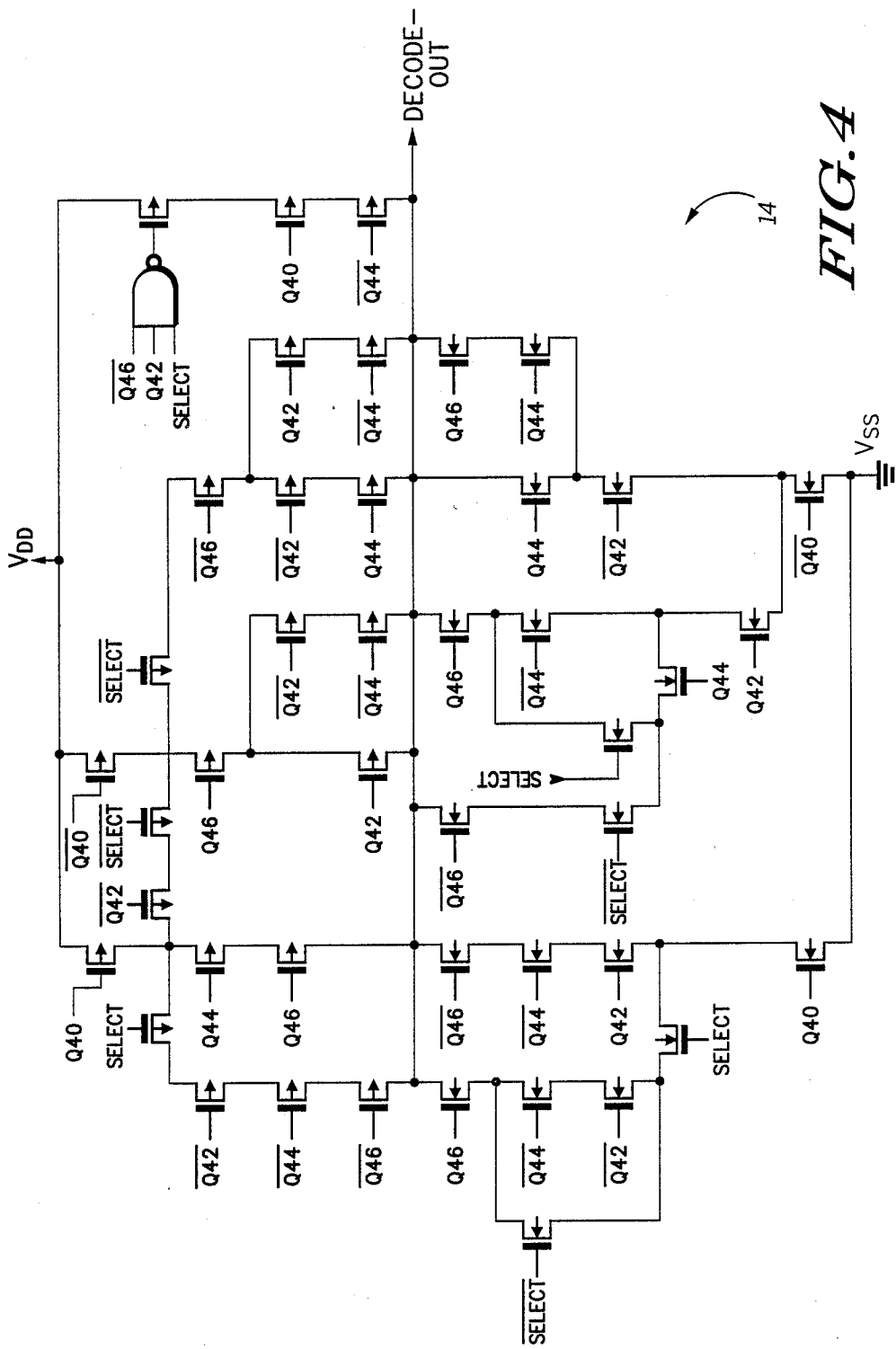
FIG. 4 illustrates in schematic form the decode logic of the frequency divider circuit in FIG. 1.

Decode logic 14 implements two predetermined logical mappings of a set of ten inputs, Q40-Q46 and Select and the complements thereof, into a single decoded output. The state transition tables in FIGS. 2 and 3 describes a first and second predetermined logical mapping, respectively. The fifteen logic states as determined by the Q data outputs of D flip-flops 40, 42, 44, and 46 are unique and can be decoded into a predetermined logic value as illustrated in the Decode Out columns of each of the tables of FIGS. 2 and 3. In one form, the first and second logical mappings of FIGS. 2 and 3 are implemented by decode logic 14 as schematically illustrated in FIG. 4. It should be well understood that the first and second predetermined logical mappings can also be implemented by other logic circuitry, or by a PLA structure. Decode logic 14 is illustrated as a single complex CMOS logic gate to minimize transistor count and area.

During operation of clock edge selector 16, D flip-flop 34 latches data from the Decode Out ouput terminal of decode logic 14 on positive, or rising, edges of the clock input signal. In contrast, flip-flop 36 latches data from the Decode Out terminal of decode logic 14 on negative, or falling, edges of the Clock input signal. Flip-flop 34 and flip-flop 36 are each reset in response to the Reset input signal. Flip-flop 38 is reset if the logic OR of the Reset input signal and the Select signal is a logic high. AND gates 28 and 30 and OR gate 32 select a predetermined Q data output from either flip-flop 34 or flip-flop 36 to be coupled to the Divide Out output terminal depending on the Q data output of flip-flop 38. The Q data output of flip-flop 38 provides a control signal to second multiplexor 56 which is toggled by the complemented $\overline{Q34}$ data output of flip-flop 34 on falling edges of the Q data output of flip-flop 34.

Figure 5:
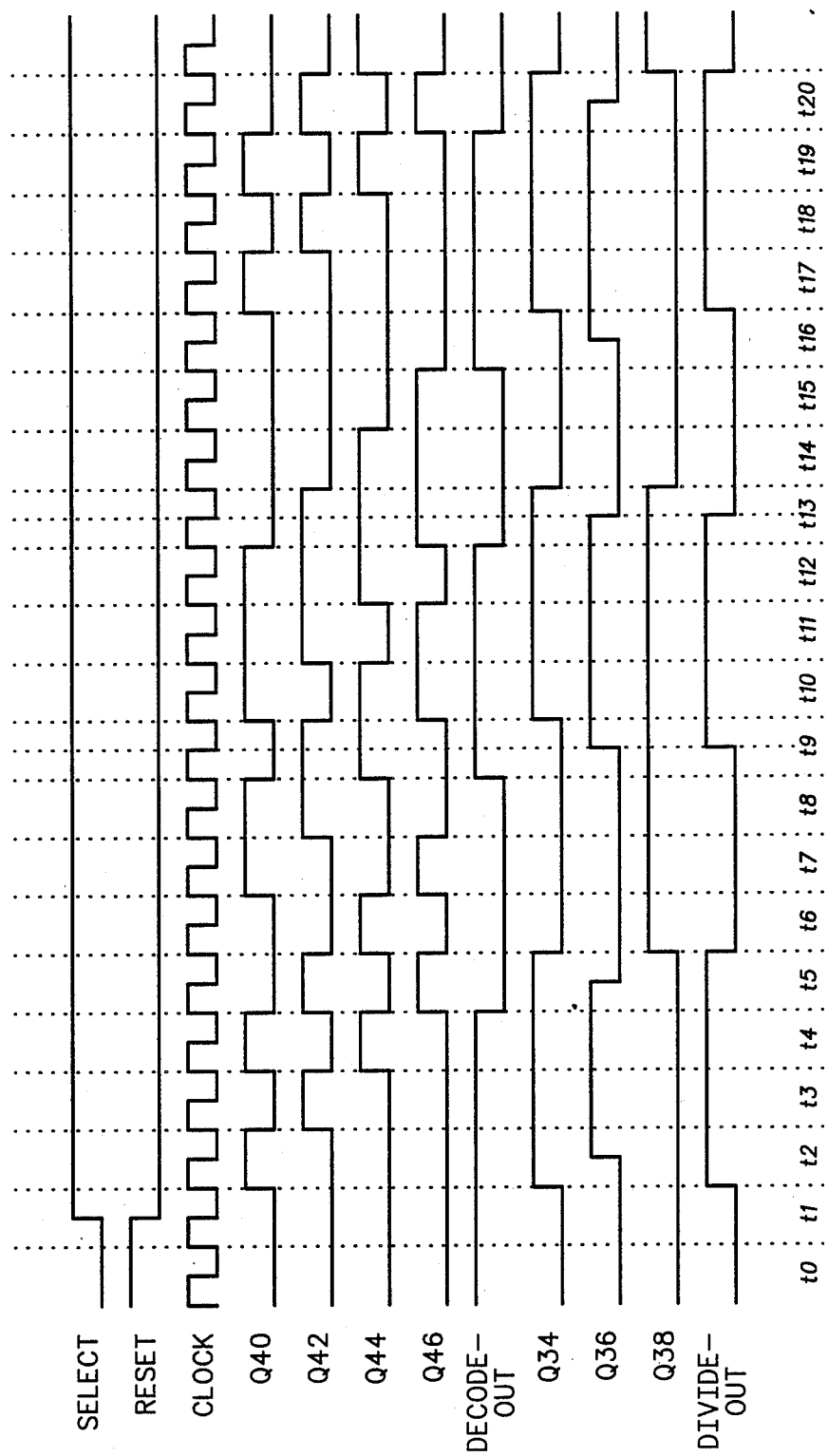
FIG. 5 is a timing diagram which illustrates the operation of the frequency divider circuit of FIG. 1 during a non-integer divisor mode of operation.

As previously mentioned, two modes of operation exist for the frequency divider circuit 70. The state transition table in FIG. 2 describes a first mode of operation determined by a logic high value for the input Select signal, wherein the output of exclusive NOR gate 24 is selected by multiplexor 54 as the data input to flip-flop 40. This first mode of operation corresponds to operation of frequency divider circuit 10 as a divide-by-7.5 circuit. Illustrated in FIG. 5 is a timing diagram which demonstrates the operation of frequency divider circuit 10 during the first mode of operation, which will now be discussed.

During an initial time period t0, the Reset signal is a logic high and frequency divider circuit 10 is placed in an initial reset mode. The Clock siganl continues to oscillate at a predetermined frequency, but signals Q40, Q42, Q44, Q46, Decode Out, Q34, Q36, and Q38 are at a logic low, and remain at a logic low for the duration of the reset period. The initial reset mode is employed to reset polynomial counter 12 and clock edge selector 16 to a known initial logic state if frequency divider circuit 10 is in an indeterminate state. As an example, consider operation of polynomial counter 12 in a sixteenth logic state corresponding to a logic high at all Q data outputs, or 1111. Although this logic state is a valid hardware state, the sixteenth logic state is not described in the logic table in FIG. 3 because it represents an unwanted state wherein all the flip-flops of polynomial counter 12 will continue to output a logic high value indefinitely. This can be understood by looking at the feedback loop created by exclusive NOR gates 24 and 26. Regardless of which Q data output is connected to the inputs of exclusive NOR gates 24 and 26, the logical exclusive NOR of two logic high input signals will maintain a logic high output. During the sixteenth logic state, a logic high value is constantly received at the data input of flip-flop 40, and is propagated through flip-flops 42, 44 and 46. Hence, a sixteenth state of all logic ones will continue indefinitely. Therefore, a reset operation can be initiated to return polynomial counter 12 to the original logic state 0000.

During a following time period t1, the Resent input signal transitions to a logic low value and the Select signal transitions from a logic low value to a logic high value, placing frequency divider circuit 10 in an active divide-by-7.5 mode. At the end of time period t1, polynomial counter 12 commences to count on the rising edge of the input Clock signal from an initial logic state 0000 to a second logic state 0001, while the Decode Out signal from decode logic 14 remains at a logic high. The Q data output of flip-flop 34 and the Divide Out output signal remain at a logic low during time period t1 while awaiting a positive clock edge to change logic state. Because data is latched only on falling edges of the input Clock signal, the Q output data of flip-flop 36 remains at a logic low during time period t1. similarly, the Q output data of flip-flop 38 also remains a logic low during time period t1 as data is latched only on the rising edge of complemented data output $\overline{Q34}$ of flip-flop 34. From a time period labeled t2 to a last time period t20, signals Q40, Q42, Q44, Q46, and the Decode Out signal transition on rising edges of the input Clock signal. Also, logic values according to the first predetermined logical mapping illustrated in the table in FIG. 3 may be assumed. Functionality of frequency divider circuit 10 is determined by concentrating solely on the Decode Out signal and the Q outputs of flip-flops 34, 36 and 38 during the remaining time periods.

At the beginning of time period t2, flip-flop 34 latches the Decode Out signal at the rising edge of input Clock signal and transitions from an initial logic low value to a logic high value. The Q data output of flip-flop 38 remains at a logic low as it awaits a positive edge at its clock input to toggle output values. In response to a logic low value at the Q output of flip-flop 38, first multiplexor 56 selects the Q output of flip-flop 34 to be provided as the Divide Out signal, which transitions from a logic low to a logic high. During the middle of time period t2, the Decode Out signal is latched by flip-flop 36 on the falling edge of the input Clock signal, and the Q output of flip-flop 36 transitions from a logic low value to a logic high value. During the next three time periods t3, t4, and t5, the Q output of flip-flop 34 remains at a logic high, and similarly, the Divide Out output signal also remains high. From time period t2 to time period t5, the Divide Out output signal remains high for a total of four clock cycles.

At the beginning of time period t6 shown in FIG. 5, the Divide Out output signal transitions from a logic high to a logic low. An explanation for this transition now follows. At the beginning of time period t5, the Decode Out output signal changes from a logic high to a logic low according to the predetermined logical mapping in FIG. 2. In response, data is latched by flip-flop 34 on the succeeding positive clock edge at the beginning of time period t6, which forces the Q output of flip-flop 34 to transition from a logic high to a logic low. Observing a rising edge at its clock input, flip-flop 38 toggles output states from a logic low to a logic high, thereby selecting the Q output data of flip-flop 34 as the new circuit output signal during time period t6. Since the Q output data of flip-flop 36 is a logic low, the Divide Out output signal is forced to a logic low. From time period t6 to the middle of time period t9, the Divide Out output signal remains a logic low for a duration of 3.5 clock cycles.

Substantially during the middle of time period t9, the Divide Out output signal transitions to a logic high on the falling edge of the Clock input signal in response to an identical transition in the Q output of flip-flop 36. Similarly, the Divide Out output signal transitions to a logic low on the falling edge of the Clock input signal during time period t13. Once again, the Divide Out output signal remains at a logic high for a duration of 4 clock cycles from the middle of time period t9 to the middle of time period t13.

At the beginning of time period t17, the Divide Out output signal transitions to a logic high in response to the transition of the Q output of flip-flop 34. Earlier, the toggling of the Q data output of flip-flip 38 from a logic high to a logic low had selected the Q output of flip-flop 34 as the output signal. The Divide Out output signal remains a logic high for a total of four clock cycles, until time period t20, at which point the timing sequence begins to repeat. The transition from a logic high to a logic low at the end of time period t20 occurs for substantially the same reasons as the transition at the end of time period t5. In fact, a steady state condition is reached in which the period from t6 to t20 is repeated for the duration of the operation of frequency divider circuit 10.

At this time, it is beneficial to review the results of the analysis of frequency divider circuit 10 and the timing diagram in FIG. 5. In response to a Clock input signal and a Select control signal, the Divide Out output signal has been generated with a duty cycle of four clock cycles at a logic high, and 3.5 clock cycles at a logic low. The period of oscillation for the Divide Out output signal represents a 7.5 fold increase over the initial period of oscillation for the input Clock signal. Thus, it can be concluded that during the above described mode of operation, frequency divider circuit 10 functions as a divide by 7.5, or non-integer, circuit.

During a second mode of operation, the output of exclusive NOR gate 24 is selected by first multiplexor 54 as the data input to flip-flop 40. This second mode of operation is determined by a logic low value for the Selct input signal, and corresponds to operation of frequency divider circuit 10 as a divide by six circuit. The table in FIG. 3 describes a second predetermined logical mapping implemented in decode logic 14 in FIG. 4. Further illustrated in FIG. 6 is a timing diagram demonstrating the operation of frequency divider circuit 10 in a divide-by-six mode, which will now be discussed.

Similar to the noninterger mode of operation, an initial time period t0 is used to reset the frequency divider ciruicit 10 to a known logic state in case of indeterminacy in the circuit. During time period t1, the Select and Reset input signals transition to a logic low, indicating operation of the frequency divider in a divide-by-6 mode. The Q output signals of flip-flops 40, 42, 44 and 46 and the Decode Out signal of decond logic 14 change logic states according to the logic transition table in FIG. 3, beginning in time period t2. At the start of time period t2, the Divide Out output signal of circuit 10 transitions from a logic low to a logic high during the rising edge of the input Clock signal. As can be seen in the timing diagram of FIG. 6, this transition is due to an identical transition in the Q output signal of flip-flop 34 which is selected by first multiplexor 56 due to a logic low value at the Q output of flip-flop 38. The Divide Out signal remains a logic high for a duration of three clock cycles. At the start of time period t5, the Divide Out output signal transitions from a logic high to a logic low. Again, this logic transition is due to an identical transition in the Q output of flip-flop 34, which remains selected as the output signal due to a logic low value at the Q output of flip-flop 38. the succeeding time periods display substantially the same behavior. Complete cycles of the Divide Out output signal are generated by an identical repetitive set of circuit conditions every six cycles of the Clock input signal.

Figure 6:
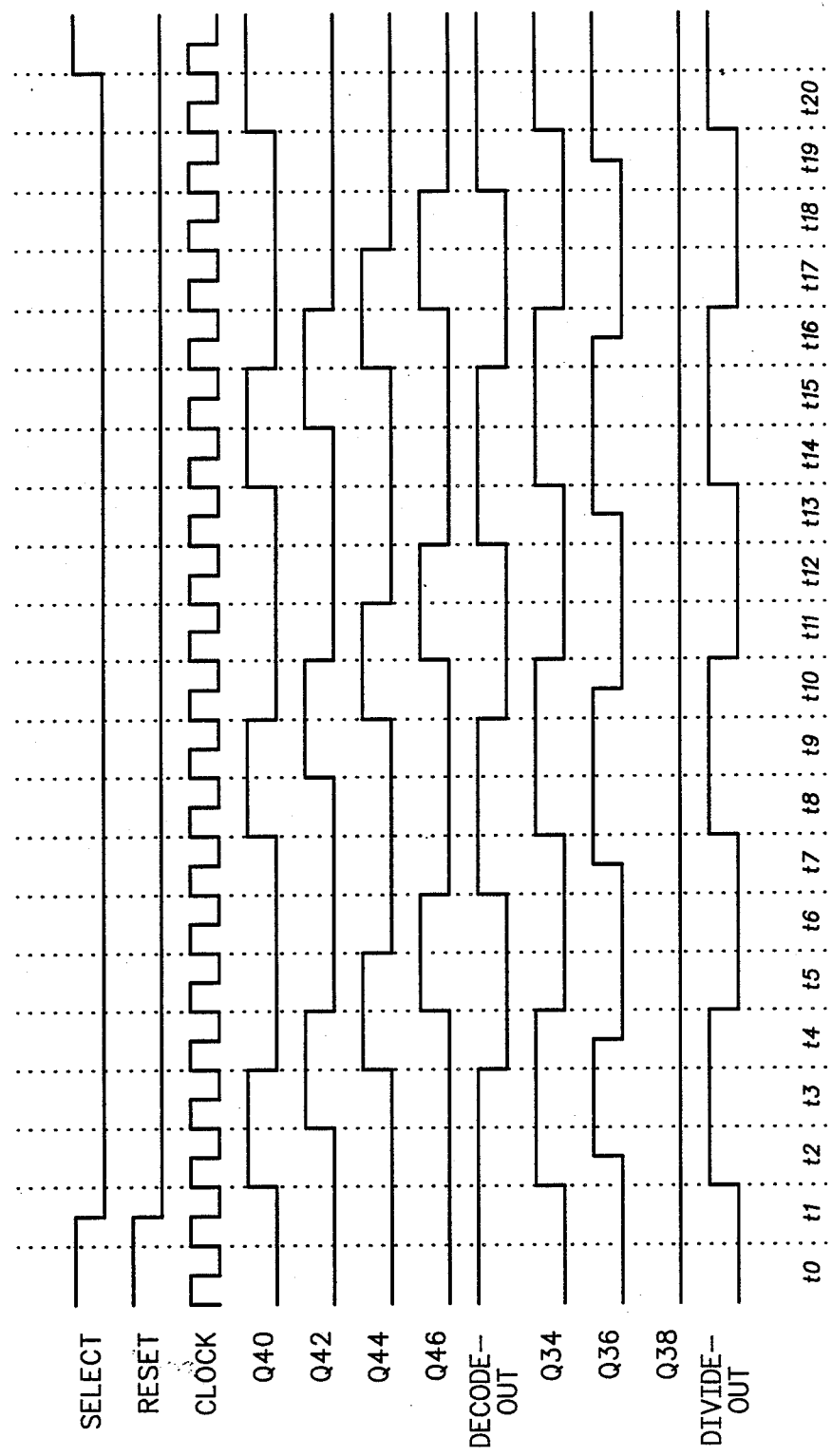
FIG. 6 is a timing diagram which demonstrates the operation of the frequency divider circuit of FIG. 1 during the integer divisor mode of opertion.

Furthermore, it can be noted from FIG. 6 that the Q output of flip-flop 38 remains a logic low during the entire second mode of operation, thereby permanently selecting the Q output data of flip-flop 34 as the output signal. In particular, it can be noted that the Q output data of flip-flop 38 remains a logic low due to a permanent logic high value at the output of OR gate 50. The output of OR gate 50 is coupled to the reset input of flip-flop 34 and places flip-flop 34 in a continual reset mode during the divide-by-six mode of operation. Further, it can be noted that the Q data output of flip-flop 36 can be ignored during the second mode of operation due to the permanent selection of the Q data output of flip-flop 34 as the output signal.

Again, it is beneficial to review the results of the analysis of frequency divider circuit 10 and the timing diagram in FIG. 6. In response to an input Clock signal and a Select control signal, the Divide Out output signal is generated with a duty cycle of three clock cycles at a logic high and three clock cycles at a logic low. The period of oscillation for the Divide Out output signal represents a six-fold increase over the initial period of oscillation for the input Clock signal. Thus, it can be concluded that during the second mode of operation, frequency divider circuit 10 functions as a divide-by-six circuit.

By now it should be apparent that a frequency divider circuit with selectable integer and non-integer divisors has been provided. Assuming propagation delays in decode logic 14 do not limit maximum speeds, the frequency divider circuit 10 displays constant propagation delay or latency, with respect to any given selection of integer or non-integer divisors. Moreover, frequency divider circuit 10 utilizes fully synchronized flip-flops which reduce the effect of clock skew on the precision of generated frequency multiples.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention

I claim:

1. A divide circuit for dividing an input signal having a predetermined frequency by either an integer or noninteger divisor to provide an output signal of divided frequency, said divide circuit comprising:

counting means responsive to said input signal, for counting from a predetermined initial state value to a final predetermined state value at a rate determined by said input signal and generating a set of encoded output signals indicating a present state value of said counting means;

first logic means coupled to the counting means and responsive to said set of output signals, said first logic means implementing a predetermined logical mapping of said output signals to provide a decoded output signal; and second logic means coupled to the first logic means further comprising:

a first flip-flop responsive to said decoded output signal of said first logic means, said first flip-flop latching the decoded output signal from said first logic means at a rate determined by said input signal, and generating an output signal having a logic value determined by both the input signal and the decoded output signal;

a second flip-flop also responsive to said decoded output signal of said first logic means and also latching the decoded output signal from said first logic means at a rate determined by said input signal, and generating an output signal having a logic value determined by both the input signal and the decoded output signal; and selection means responsive to said output signal of both said first and second flip-flops, said selection means dynamically selecting either said output signal of said first or said second flip-flop, in a sequence determined by the divisor, as the output signal of divided frequency.

2. The divide circuit of claim 1 wherein said second flip-flop of said second logic means latches data from said decoded output signal of said first logic means at a rate determined by said input signal with a predetermined frequency, but delayed by substantially one-half cycle of said input signal.

3. The divide circuit of claim 2 wherein said counting means is a polynomial counter which counts from a first state value to a second state value based on a predetermined logical combination of the encoded output signals.

4. A divide circuit for dividing an input signal having a predetermined frequency, said divide circuit comprising:

counting means responsive to said input signal for counting, in either a first counting sequence, from an first initial state value to a first final state value at a rate determined by said input signal, or in a second counting sequence, from a second initial state value to a second final state value at a rate determined by said input signal, said counting sequence determined by a select signal, said counting means generating a set of encoded output signals indicating a present state value of said counting means;

first logic means responsive to said encoded output signals, said first logic means implementing either a first or a second predetermined logical mapping of said encoded output signals in response to the select signal to provide a decoded output signal; and p1 second logic means coupled to the first logic means, comprising:

a first flip-flop responsive to said decoded output signal, said first flip-flop latching the decoded output signal on a clock edge of first transitioning direction of the input signal, and generating an output signal in response thereto;

a second flip-flop also responsive to said decoded output signal, said second flip-flop latching the decoded output signal on a clock edge of second transitioning direction of the input signal, and generating an output signal in response thereto;

a third flip-flop coupled to the first flip-flop and being responsive to said output signal of said first flip-flop and generating an output signal in response thereto; and a multiplexor with a first input coupled to said output signal of said first flip-flop, a second input coupled to said output signal of said second flip-flop, and a third input coupled to said output signal of said third flip-flop, said third flip-flop controlling selection by the multiplexor of one of the outputs of the first and second flip-flops to provide as a divided frequency output signal.

5. The divide circuit of claim 4 wherein said counting means is a polynomial counter which counts from a first state value to a second state value based on a predetermined logical combination of the encoded output signals.

6. The divide circuit of claim 5 wherein said counting means further comprises:

means for resetting said counting means to either the first initial state value of said first counting sequence or to the second initial state value of said second counting sequence in response to a reset signal.

7. A method for generating an output signal having frequency multiples of an input signal of predetermined frequency by dividing the input signal by a predetermined divisor, comprising the steps of:

counting from an initial state value to a final state value with a digital counter at a rate determined by said input signal;

generating a set of encoded output signals indicating the present state value of said digital counter;

decoding said output signals to provide a decoded signal in accordance with a predetermined logical mapping;

latching said decoded signal in a first flip-flop at a rate determined by said input signal;

latching said decoded signal in a second flip-flop at a rate also determined by said input signal; and dynamically selecting, in a sequence determined by the predetermined divisor, either an output signal of the first or the second flip-flop.

8. The method of claim 7 wherein the step of generating encoded output signals further comprises the step of:

sequentially providing state values as the encoded output signals in response to the encoded output signals, each state value provided in response to a predetermined logical combination of the encoded output signals.

9. The method of claim 8 wherein the step of latching the decoded signal in the second flip-flop further comprises the step of:

delaying said latching in the second flip-flop substantially by one-half of a cycle of said input signal.

10. The method of claim 9 further comprising the step of:

resetting said digital counter to said initial logic value in response to a reset signal.

11. A method for generating an output signal having frequency multiples of an input signal of predetermined frequency by dividing the input signal by a predetermined divisor, comprising the steps of:

counting from a first initial state value to a first final state value in a digital counter in a first counting sequence at a rate determined by said input signal in response to a select signal having a first logic state;

counting from a second initial state value to a second final state value in said digital counter in a second counting sequence at a rate determined by said input signal in response to the select signal having a second logic state;

generating a set of encoded output signals indicating a current state value of said digital counter;

decoding said encoded output signals to provide a decoded signal in accordance with a first predetermined logical mapping if said select signal is in the first logic state;

decoding said encoded output signals to provide the decoded signal in accordance with a second predetermined logical mapping if said select signal is in the second logic state;

latching said decoded signal in a first flip-flop at a rate determined by said input signal and providing an output signal in response thereto;

latching said decoded signal in a second flip-flop at a rate determined by said input signal and providing an output signal in response therto; and continuously selecting, in a predetermined sequence, the output signal of either the first or second flip-flops as the output signal.

12. The method of claim 11 wherein the step of generating a set of encoded output signals further comprises the step of:

sequentially providing state values as the encoded output signals in response to the encoded output signals, each state value provided in response to a predetermined logical combination of the encoded output signals.

13. The method of claim 11 wherein the step of latching the decoded signal in the second flip-flop further comprises the step of:

delaying said latching in the second flip-flop substantially by one-half of a cycle of said input signal.

14. The method of claim 13 further comprising the step of:

resetting the counting of state values in response to a reset signal.

* * * * *